(12) United States Patent
Nakadaira

(10) Patent No.: US 7,541,853 B2
(45) Date of Patent: Jun. 2, 2009

(54) SPREAD SPECTRUM BLOCK CONTROL APPARATUS AND SPREAD SPECTRUM CLOCK GENERATING APPARATUS

(75) Inventor: Masao Nakadaira, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 154 days.

(21) Appl. No.: 11/717,151

(22) Filed: Mar. 13, 2007

(65) Prior Publication Data

US 2007/0217483 A1    Sep. 20, 2007

(30) Foreign Application Priority Data

Mar. 14, 2006    (JP) .............................. 2006-069374

(51) Int. Cl.
  *H03K 3/00*    (2006.01)
(52) U.S. Cl. ..................... 327/241; 327/279; 327/291
(58) Field of Classification Search ................ 327/241, 327/291, 279
  See application file for complete search history.

(56) References Cited

U.S. PATENT DOCUMENTS

| 5,812,831 A * | 9/1998 | Crocker ..................... 713/500 |
| 6,112,309 A * | 8/2000 | Inoue et al. ................. 713/501 |
| 2004/0252751 A1 | 12/2004 | Ogasawara |

FOREIGN PATENT DOCUMENTS

JP    2005-004451    1/2005

* cited by examiner

Primary Examiner—Kenneth B. Wells
(74) Attorney, Agent, or Firm—Foley & Lardner LLP

(57) ABSTRACT

A phase interpolator receives an input clock signal and varies the phase of an output clock signal in accordance with a phase control signal. An SSC controller, which generates the phase control signal applied to the phase interpolator, includes a pre-divider for outputting a frequency-divided clock obtained by frequency-dividing the input clock signal by a prescribed dividing value; a first counter receiving the frequency-divided clock from the frequency divider and repeatedly up-counting and down-counting by a predetermined first count, the first counter having a state machine for holding the present state; a second counter receiving the output signal of the first counter and repeatedly up-counting and down-counting by a predetermined second count, the second counter having a state machine for holding the present state; and a controller receiving the frequency-divided clock from the frequency divider, the counts from the first and second counters and the state of the second counter, and outputting a down signal, which retards the phase of the output clock signal, based upon the count values and states of the first and second counters at a timing decided by the frequency-divided clock. In the repetition of the counting operation of the first counter, the controller uses the same combinational logic. The controller has an inversion control circuit for inverting the signal when the states of the counters are predetermined prescribed states.

12 Claims, 13 Drawing Sheets

SPREAD SPECTRUM BLOCK CONTROL APPARATUS AND SPREAD SPECTRUM CLOCK GENERATING APPARATUS

FIELD OF THE INVENTION

This invention relates to a clock generating circuit and, more particularly, to a spread spectrum clock generator.

BACKGROUND OF THE INVENTION

When a clock generator in an electronic device generates a single frequency, emission of this frequency and higher harmonics increases. For this reason, use is made of a spread spectrum clock generator (SSCG) that reduces the peak of unnecessary emissions by frequency modulation and diminishes EMI (electromagnetic interference).

Operating frequencies have risen in recent years and the problem of bit-to-bit skew in a parallel bus has become more conspicuous. This has led to the widespread use of serial interfaces which are free of bit-to-bit skew and such serial interfaces have come to be employed also in personal computers in general use. For example, SATA (Serial ATA) is used as the interface standard between a hard disk and a CPU. SATA is a serial interface standard in which the first-generation communication speed is 1.5 Gbps and incorporates a spread spectrum clock (SSC) standard as an EMI countermeasure in order to be used in personal computers and the like.

In general, a PLL (phase-locked loop) using a pulse-swallow frequency divider is employed as an SSCG. However, an SSCG that employs a phase interpolator and a controller and not a pulse-swallow frequency divider and VCO (voltage-controlled oscillator) also is known in the art (see Patent Document 1 field by the present applicant). An example of structure in line with the SSC standard of SATA (third example) is illustrated in Patent Document 1. However, the compression of logic in a controller that generates a down signal is difficult with a combination of counters, and it is difficult to reduce the scale of the circuitry. It is necessary, therefore, to consider a combination with which the compression pf logic is possible. This will be described below.

Disclosed in Patent Document 1 is an example (the third example in Patent Document 1) well suited to the SSC standard (degree of modulation: 0 to −5000 ppm; modulation frequency: 30 to 33 kHz) of SATA. FIG. 9 is a diagram illustrating the arrangement disclosed in Patent Document 1. The arrangement includes a phase interpolator 4 which receives an input signal from an input terminal 1 and outputs an output clock signal the phase of which has been varied based upon a phase control signal, and an SSC (spread spectrum clock) controller 3' which supplies a phase control signal (down signal 6) to the phase interpolator 4 to frequency-modulate the output clock from an output terminal 2. The SSC controller 3' has a pre-divider 21, a p-counter 22', an up/down counter 23' and a controller 24'. The down signal 6 is supplied to the phase interpolator 4 from the controller 24', the frequency of occurrence of a delay Δ (see FIG. 10) of a prescribed amount with respect to the clock signal that is supplied to the input terminal 1 is controlled and a modulated clock is output from the output terminal 2, thereby implementing an SSCG suited to a standard referred to as "downspread".

In Patent Document 1, the phase step of the phase interpolator 4 in FIG. 9 is assumed to be 1/64 [resolution N=64, in which case period $T_0$ of the input clock signal=1/64 of 1/(1.5 GHz) holds] and the frequency dividing ratio of a pre-divider 21 is assumed to be 4. A conditional equation for meeting the SATA standard is as follows:

$$1500/0.033 \leq 2 \times m \times p \times u \leq 1500/0.03 \tag{1}$$

With regard to a count p in a p-counter 22 and a count u in an up/down counter 23, a value that satisfies this equation is assumed to be 77, and the modulation frequency is assumed to be 31.62 Hz.

The p-counter 22' produces an output signal 25 whenever it counts 77 times. Upon receiving this signal, the up/down counter 23' updates the value u. Based upon the combination of the value in p-counter 22' and the value in up/down counter 23', the controller 24' generates the down signal 6. FIG. 11 is a diagram illustrating 77×78 combinations of generation of the down signal 6. The count value p in p-counter 22' is indicated along the horizontal direction. Up-counting of 0 to 77 by the up/down counter 23' is indicated along the vertical direction in the upper half of FIG. 11, and down-counting of 77 to 0 by the up/down counter 23' is indicated along the vertical direction in the lower half of FIG. 11. Further, n1 is the number of logical "1"s in down signal 6 that are output from the controller 24' in a time period of a reference period number k (=m×p). The time period of the reference period number k, which is stipulated by the product of one period of the input clock signal and the reference period number k, is termed a reference period.

As illustrated in FIG. 11, the number n1 of logical "1"s of down signal 6 in the time period of the reference period number k (=m×p) is successively incremented, the frequency of occurrence of the phase delay of the phase step 1/64 (resolution N=64) of the phase interpolator 4 is raised, and the value u in the up/down counter 23' is counted up successively from 0. When u=77 holds, n1 is made 77 and the controller 24' applies maximum modulation to the output clock from output terminal 2. The value u in up/down counter 23' is subsequently counted down and n1 is successively decremented, thereby changing average frequency f in the time period of the reference period number k (=m×p).

If the phase step of the phase interpolator 4 is 1/N (=1/64) of one period $T_0$ of the clock signal at the input terminal and the average period of the clock signal when the number of down signals 6 in the time period of the reference period number k is n is represented by $T_{<average>}$, then we have $k \times T_{<average>} = k \times T_0 + (n/N) \times T_0$ and the average frequency $f_{<average>}$ is $$f_{<average>} = k / [k \times T_0 + (n/N) \times T_0]$$
$$= (1/T_0) \times (k \times N) / (k \times N + n)$$

As illustrated in FIG. 12, the modulated waveform according to the above-mentioned combination is that obtained by modulation at a modulation frequency of 31.62 kHz. A single modulation period Tfm is given by $2 \times m \times p \times u \times T_0$, and we have Tfm=31.6 µs from m=4, p=u=77, 1.5 GHz=1/$T_0$. That is, this is a triangular wave in which the maximum modulation frequency is 1.5 GHz (=1500 MHz) and the minimum modulation frequency is 1494.2 MHz.

[Patent Document 1]

Japanese Patent Kokai Publication No. JP-P2005-4451 (Pages 5 to 9, 11 to 13, FIGS. 1, 3 and 4)

SUMMARY OF THE DISCLOSURE

However, logical compression (folding) is difficult with the arrangement illustrated in Patent Document 1, in which there is a combination of counts (the count value p of p-counter 22' and the count value u of up/down counter 23' are both 77) and the number n1 of logical "1"s of the down signal 6 in the time period of the reference period number k is successively incremented. That is, the logical arrangement must be one that takes into consideration all 0 to 77 combinations of count value p in p-counter 22' and count value u in up/down counter 23'. This makes it difficult to reduce the scale of circuitry of controller 24'.

Accordingly, the present invention seeks to solve the aforementioned problems and has the structure set forth below.

An apparatus according to a first aspect of the present invention is a spread spectrum clock control apparatus for exercising control so as to supply a phase control signal to a phase interpolator which receives an input clock signal and varies the phase of an output clock signal in accordance with the phase control signal, and to frequency-modulate the output clock signal, the apparatus comprising: a first counter receiving a clock signal as an input, changing over from up-counting to down-counting at a predetermined first count number, performing the up-counting and down-counting a prescribed number of times and outputting an output signal at the moment a predetermined prescribed count number is counted, the first counter having a state machine for managing transition of state; a second counter receiving the output signal from the first counter and changing over from up-counting to down-counting at a predetermined second count number, the second counter having a state machine for managing transition of state; and a controller for controlling the phase control signal, which is supplied to the phase interpolator, based upon count values in the first and second counters and state of the second counter.

In the present invention, it is preferred that the same combinational logic be used by the controller in repetition of the counting operation of the first counter.

In the present invention, the first counter makes state transitions sequentially from an initial state whenever there is a changeover between up-counting and down-counting and, when a count equivalent to the prescribed count number makes one full cycle, returns the state to the initial state and outputs the output signal to thereby update the count value in the second counter.

In the present invention, the second counter changes over from up-counting to down-counting at the second count number, repeats a set of up-counting and down-counting operations a prescribed number of times, makes state transitions sequentially at every counting operation and returns the state to the initial state when the count makes one full cycle; and the controller controls the number of times the phase control signal is activated in a predetermined reference period based upon the count value in the first counter, the count value in the second counter and the state of the second counter.

In the present invention, the controller increases or decreases, in even-numbered units in response to one change in the count value in the second counter, the number of the phase control signals activated in the reference period.

In the present invention, the apparatus further comprises a frequency dividing circuit receiving the input clock signal for frequency dividing the input clock signal and outputting a frequency-divided clock signal; wherein the first counter counts the frequency-divided clock signal; the controller receives the frequency-divided clock signal and the count values from the first and second counters; and the reference period is stipulated by the product of a frequency division number in the frequency dividing circuit, the prescribed count number of the first counter and the clock period of the input clock signal.

In the present invention, the controller decides the number of active states of the phase control signal in the reference period from the count value in the first counter, the count value in the second counter and the state thereof, the controller having a control circuit which, in a case where the state of the second counter is a predetermined one state, inverts a signal that was an non-inverting signal in another state of the second counter corresponding to the one state.

In the present invention, the controller outputs to the phase interpolator a down signal, which retards the phase of the output clock signal, as the phase control signal.

In the present invention, the controller may be adapted to output to the phase interpolator a down signal, which retards the phase of the output clock signal, and an up signal, which advances the phase of the output clock signal, as the phase control signal, and to hold the up and down states.

In accordance with the present invention, there is provided a spread-spectrum clock generating apparatus having the phase interpolator and the above-described spread spectrum clock control apparatus according to the present invention.

In accordance with the present invention, the scale of circuitry of the controller can be reduced owing to compression (folding) of logic.

Further, in accordance with the present invention, power consumption can be reduced as a result of the reduction in the scale of the circuitry.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

EXEMPLARY EMBODIMENTS OF THE INVENTION

Figure 1:
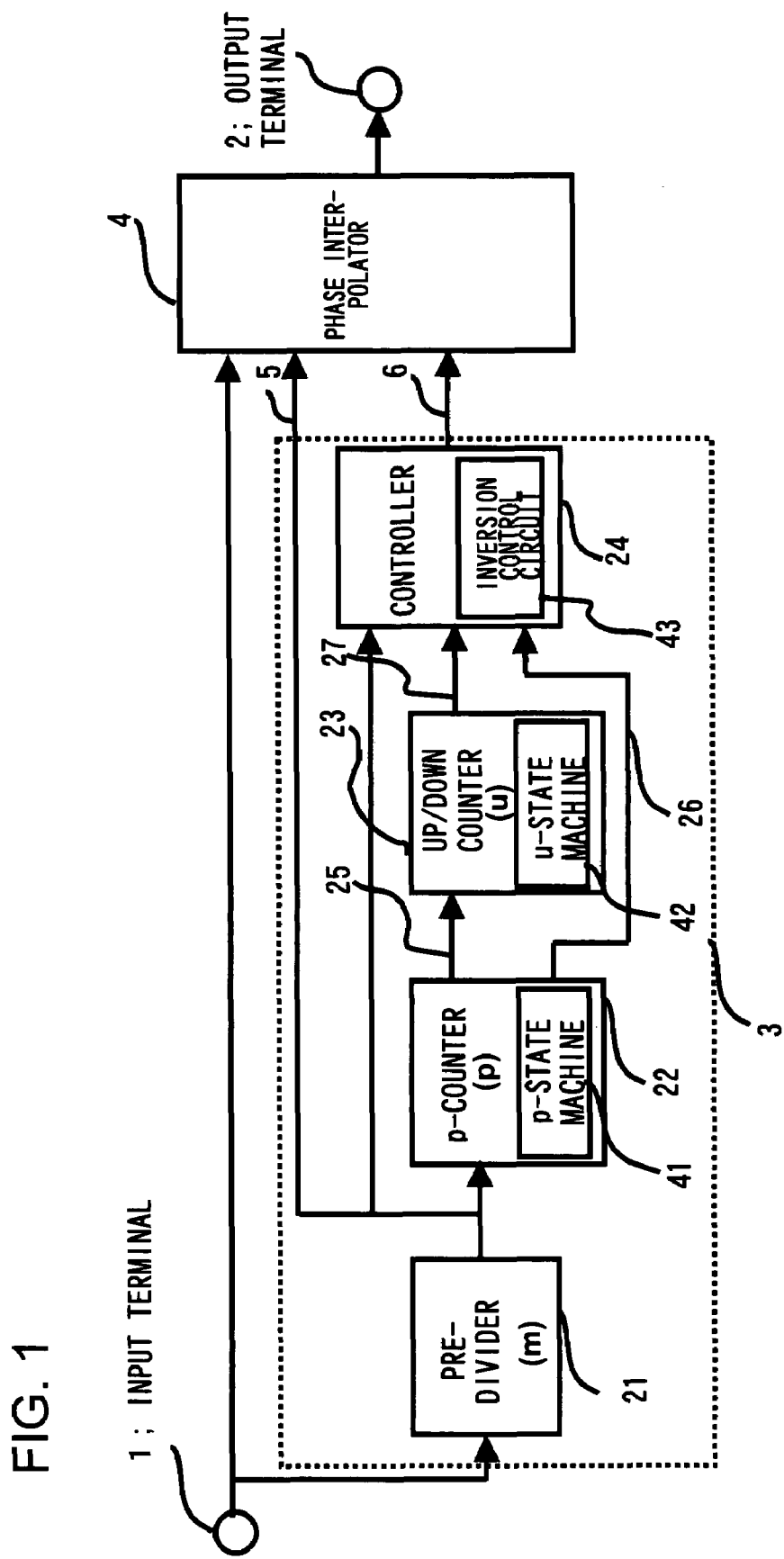
FIG. 1 is a block diagram illustrating the configuration of a first example of the present invention.

Exemplary examples of the present invention will be described in detail with reference to the accompanying drawings. In accordance with one aspect of the present invention, an SSCG (Spread Spectrum Clock Generator) has a phase interpolator (4) which receives an input clock signal and varies the phase of an output clock signal in accordance with a phase control signal (6), and an SSC (Spread Spectrum Clock) controller (3) for exercising control so as to supply the phase control signal (6) to the phase interpolator (4) and to frequency-modulate the output clock signal. A p-counter (22) in the controller (3) is constituted by an up/down counter. When the p-counter (22) repeats a counting operation, the same combinational logic is used in a controller (2). Further, an up/down counter (23) repeats up- and down-counting twice and inverts logic at the time of the second up-counting operation and at the time of the first down-counting operation. That is, the controller (24) decides the number of activated states of the down signal (6) in a reference period based upon the count value in the up/down counter and the state thereof. In this regard, the up/down counter (23) has an inversion control circuit (43). In a case where the state of the up/down counter (23) is a predetermined state (Su2 at the time of the second up-counting operation and Su3 at the time of the first down-counting operation, the inversion control circuit (43) inverts the logic of a signal that was an non-inverting signal in other states (Su1, Su4), corresponding to the states (Su2, Su3), respectively. The logical structure of the controller (24) is reduced by such an arrangement.

Alternatively, in accordance with another aspect of the present invention, a controller (32) is provided with a state machine (44) for up/down changeover, and it may be so arranged that the controller (32) is adapted to use the same logic at the time of up-counting and down-counting operations.

In accordance with the present invention, there is provided a spread spectrum clock generator (SSCG) comprising the SSC controller, which is constructed as set forth above, and a phase interpolator.

Figure 9:
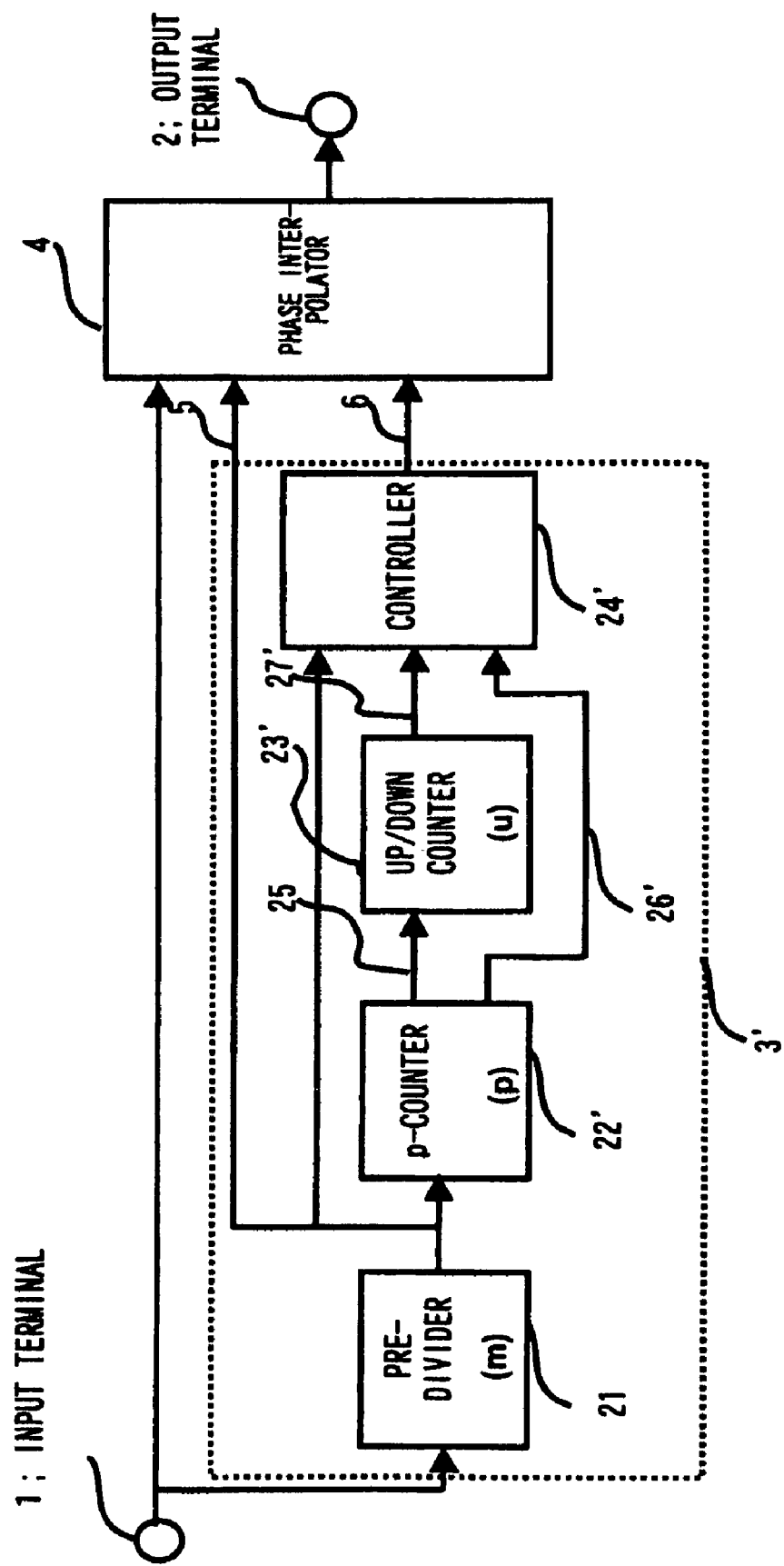
FIG. 9 is a block diagram illustrating the configuration of a third example in Patent Document 1.
Figure 10:
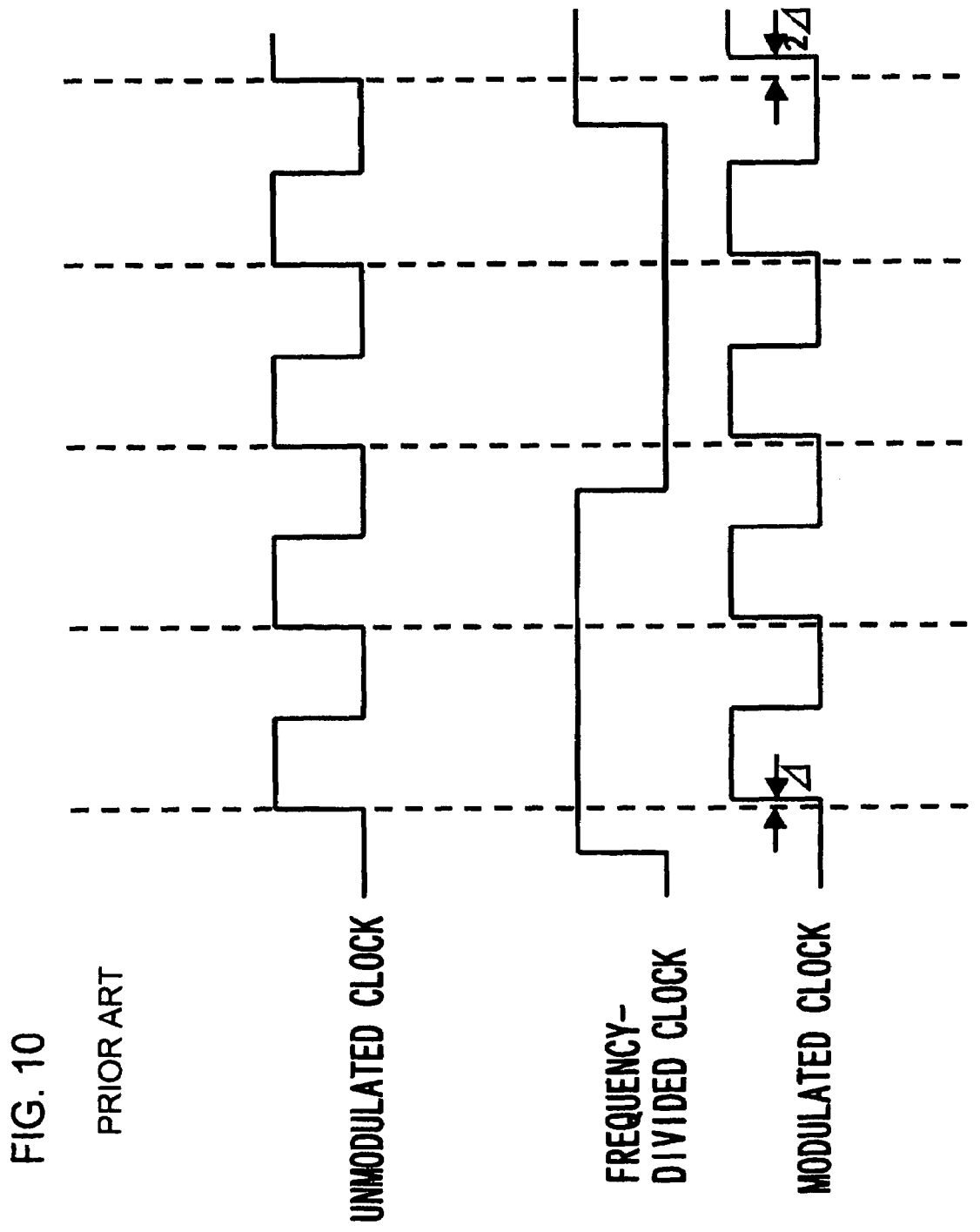
FIG. 10 is a diagram illustrating an output clock waveform in FIG. 9.
Figure 11:
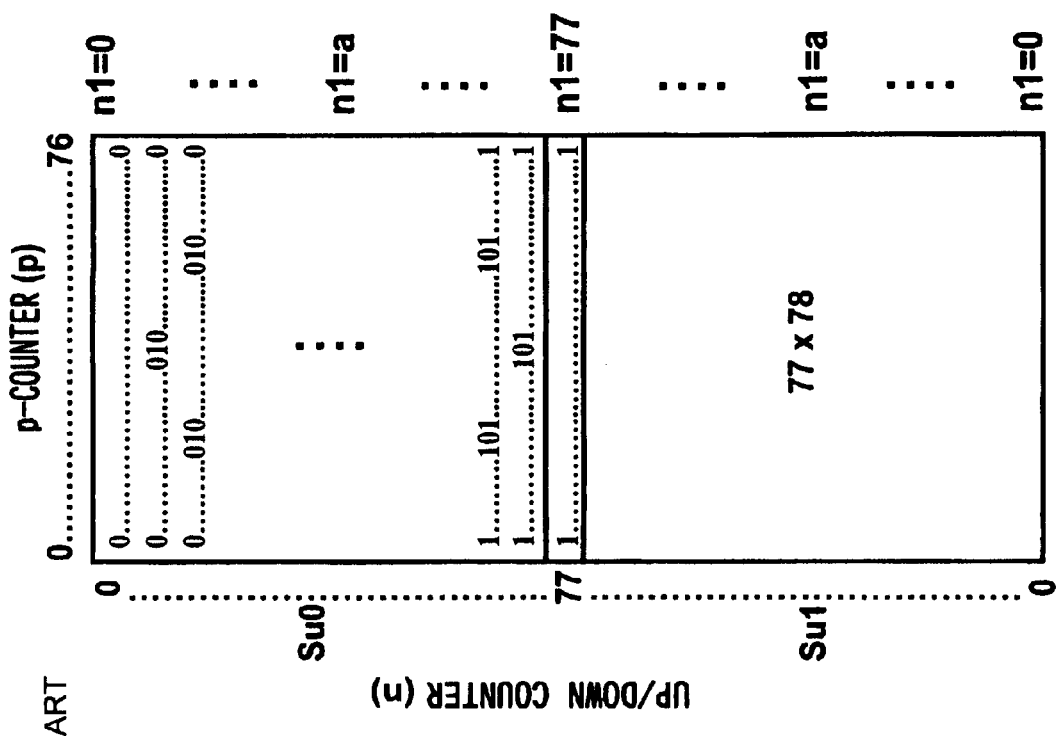
FIG. 11 is a diagram illustrating 77×78 combinations of down-signal generation in the third example of Patent Document 1.
Figure 12:
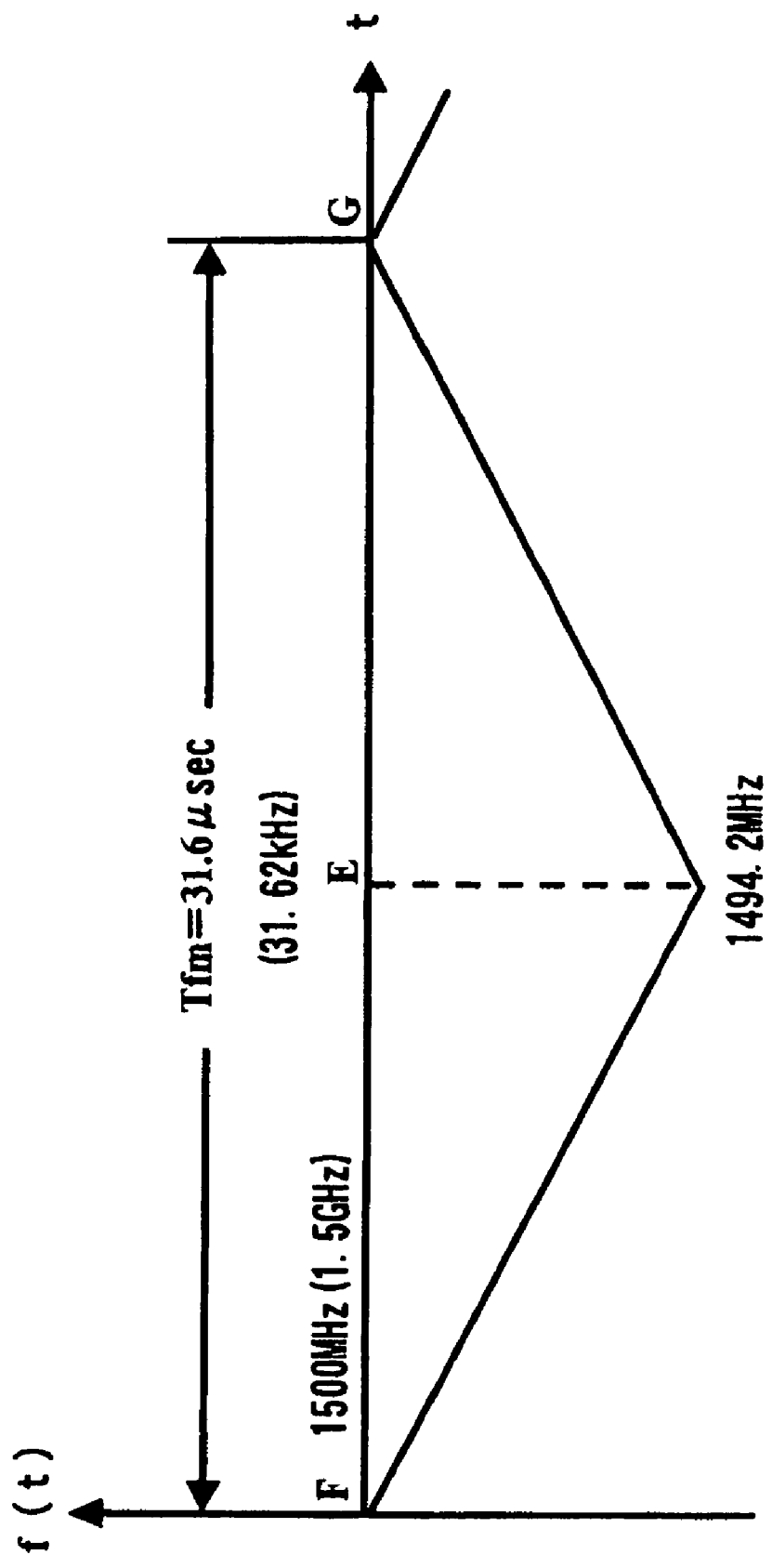
FIG. 12 is a diagram illustrating a modulation waveform in the third example of Patent Document 1.

Referring to FIG. 1, in the first example of the present invention, the SSC controller 3 includes a pre-divider 21 which receives an input clock signal from an input terminal 1, frequency-divides the frequency of the input clock signal by m and outputs a frequency-divided clock signal; a p-counter 22 which outputs an output signal 25 upon counting the frequency-divided clock 5 from the pre-divider 21 up to a count number p; an up/down counter 23 which receives and counts up and counts down the output signal 25 from the p-counter 22; and a controller 24 which receives the frequency-divided clock signal (timing signal) 5 from the pre-divider 21, a count value 26 from the p-counter 22 and a count value 27 from the up/down counter 23, and generates a down signal 6. The phase interpolator 4 receives the down signal 6 from the SSC controller 3 and outputs a clock signal, which is the result of modulating the input clock signal (of frequency $1/T_0$) from the input terminal 1, from the output terminal 2. In contrast with the conventional configuration shown in FIG. 9, this example has the p-counter 22 and up/down counter 23 provided with a p-state machine 41 and u-state machine 42, respectively, and the controller 24 provided with the inversion control circuit 43. The operating principles of this example will be described first.

In accordance with this present example, the following:

$$p=108, u=54$$

is a combination of count number p in p-counter 22 and count number u in up/down counter 23 that satisfies the above-cited conditional equation (1) for meeting the SATA standard.

Further, a number n1 of logical "1"s in the down signal 6 in the time period of the reference period number k is increased successively two at a time.

Owing to this arrangement, it is possible to reduce the scale of the logical circuitry of controller 24 owing to the logic folding effect.

Solving Equation (1) assuming p=2u and m=4, we have the following:

$$53.30 \leq u \leq 55.90 \qquad (2)$$

The even number 54 is employed as the u that satisfies Equation (2), the count number p in p-counter 22 is assumed to be 108, and the count number u in up/down counter 23 is assumed to be 54.

In this example, the number n1 of logical "1"s in the down signal 6 that is output from the controller 24 to the phase interpolator 4 in the time period of the reference period number k (=m×p) is proportional to the count number u in the up/down counter 23.

For example, we have the following:
n1=0 when u=0 holds;
n1=2a when u=a holds; and
n1=108 when u=54 holds.
In other words, we have the following:

$$n1=2u$$

A combinational logical matrix of generation of the down signal 6 in the controller 24 is 108×108. However, since a vertical mirror arrangement with u=54 (at the time of maximum modulation) at the center is adopted, it is possible to achieve an implementation using 108×55 combinational logic and the state machines (Su0, Su1) for up/down control of the up/down counter 23. Whenever the p-counter 22 counts to a count of 108, it outputs the output signal 25. The up/down counter 23 counts the output signal 25, up-counts the signal from 0 to 54 and down-counts the signal from 54 to 0. If we let u represent the count number in the up/down counter 23, the number n1 of logical "1"s of the down signal 6 output in the time period of the reference period number k (=m×p) becomes n1=2u at the time of up-counting and n1=2u at the time of down-counting.

Figure 2:
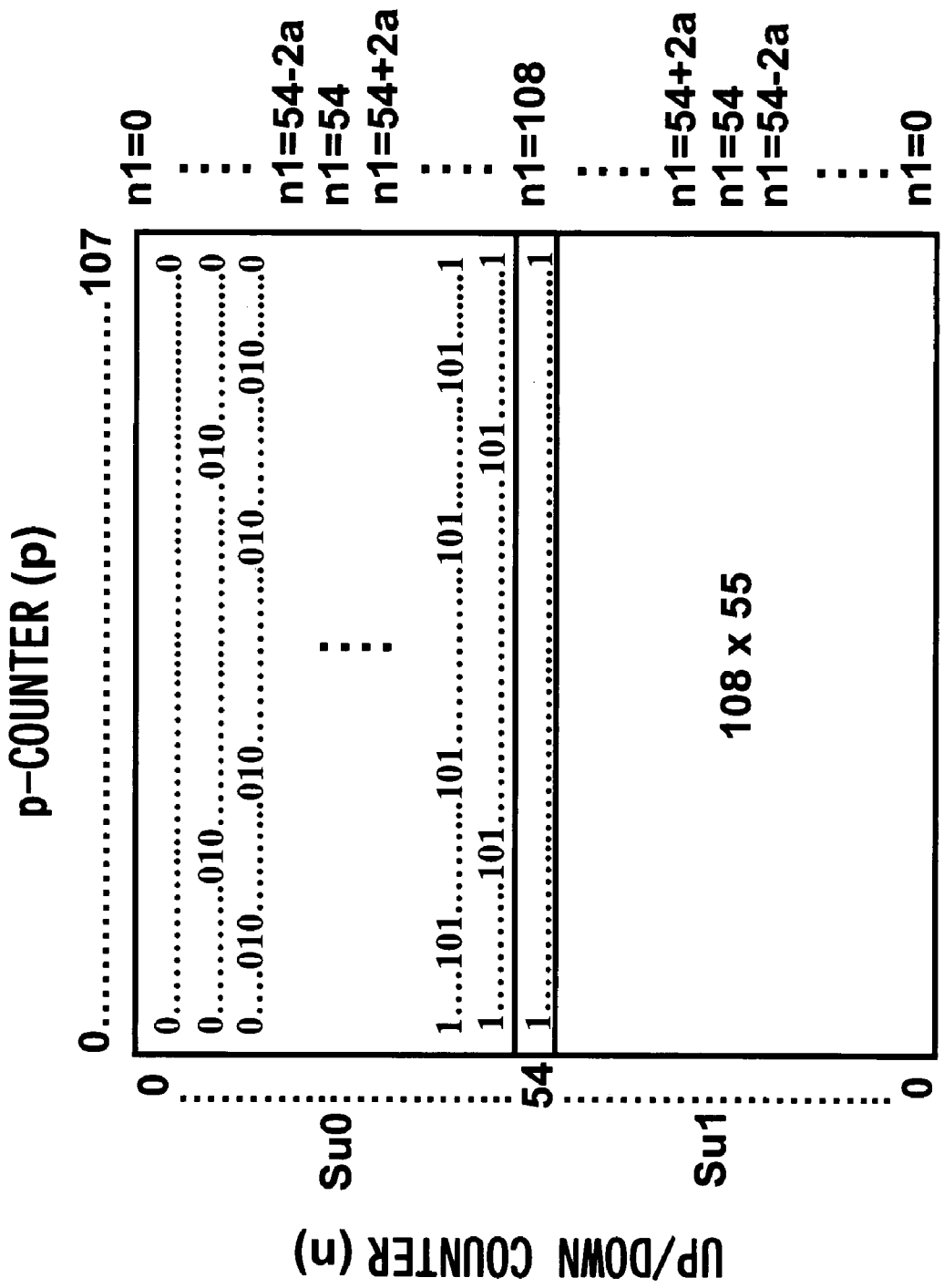
FIG. 2, which is a diagram useful in describing the operating principles of the present invention, illustrates 108×55 combinations of down-signal generation.
Figure 3:
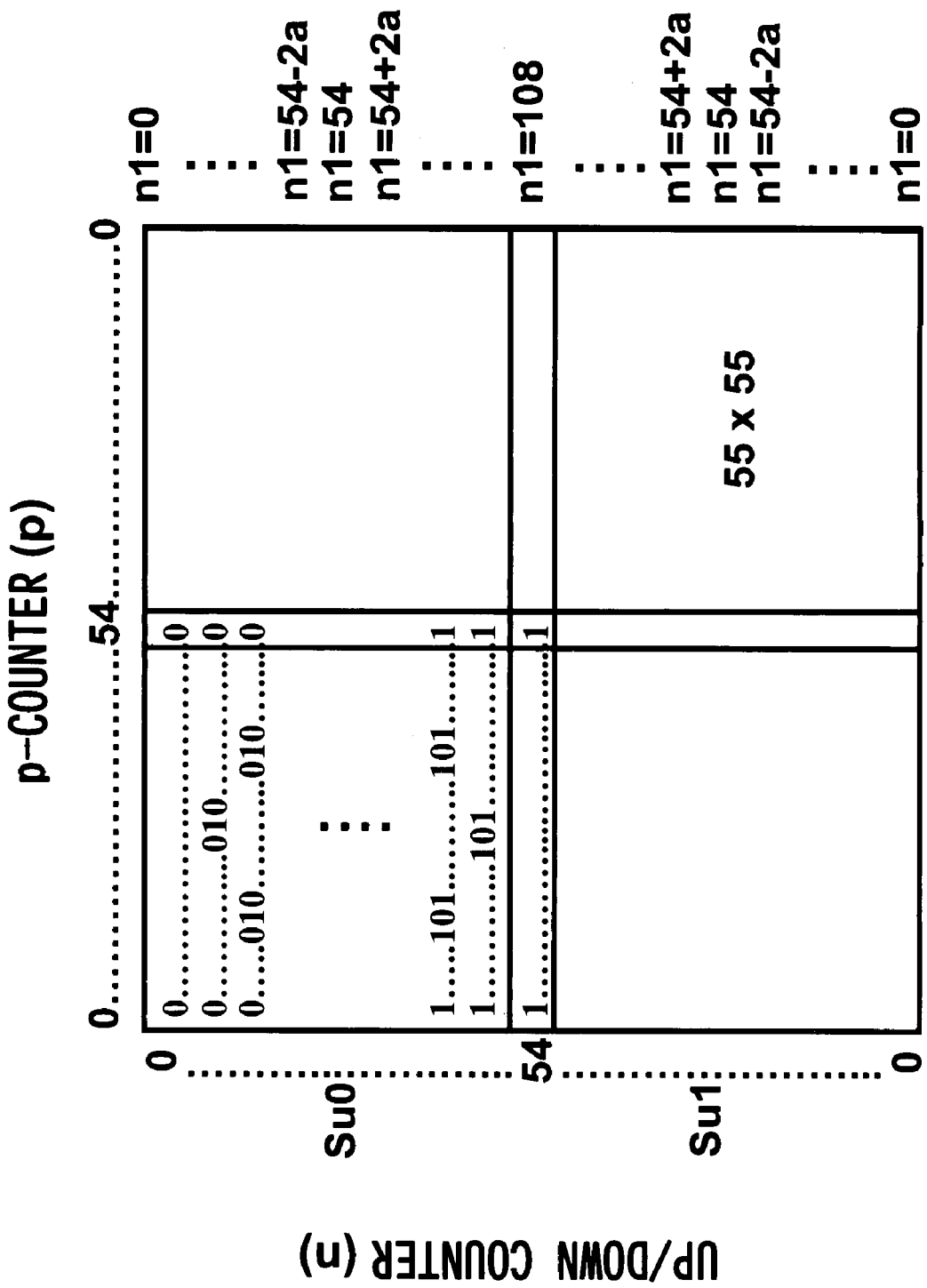
FIG. 3, which is a diagram useful in describing the operating principles of the present invention, illustrates 55×55 combinations of down-signal generation.

By adopting an even number (n1=2u) as the value taken on by the number n1 of logical "1"s of down signal 6 in the time period of the reference period number k (=m×p), the 108×55 combinational logic can be implemented by a 55×55 split mirror arrangement, as illustrated in FIG. 3. The 108×55 combinational logic in the upper half of FIG. 2 is divided into 55×55 logical matrices on the left and right sides in the upper half of FIG. 3, and the 108×55 combinational logic in the lower half of FIG. 2 is divided into 55×55 logical matrices on the left and right sides in the lower half of FIG. 3. In FIG. 3, the p-counter 22 is constituted by an up/down counter. The p-counter 22 up-counts the frequency-divided clock signal 5 of pre-divider 21 from 0 to p=54, down-counts this signal from p=54 and outputs the output signal 25 at the moment p=0 is reached. The up/down counter 23 up-counts or down-counts the output signal 25 from the p-counter 22.

Figure 4:
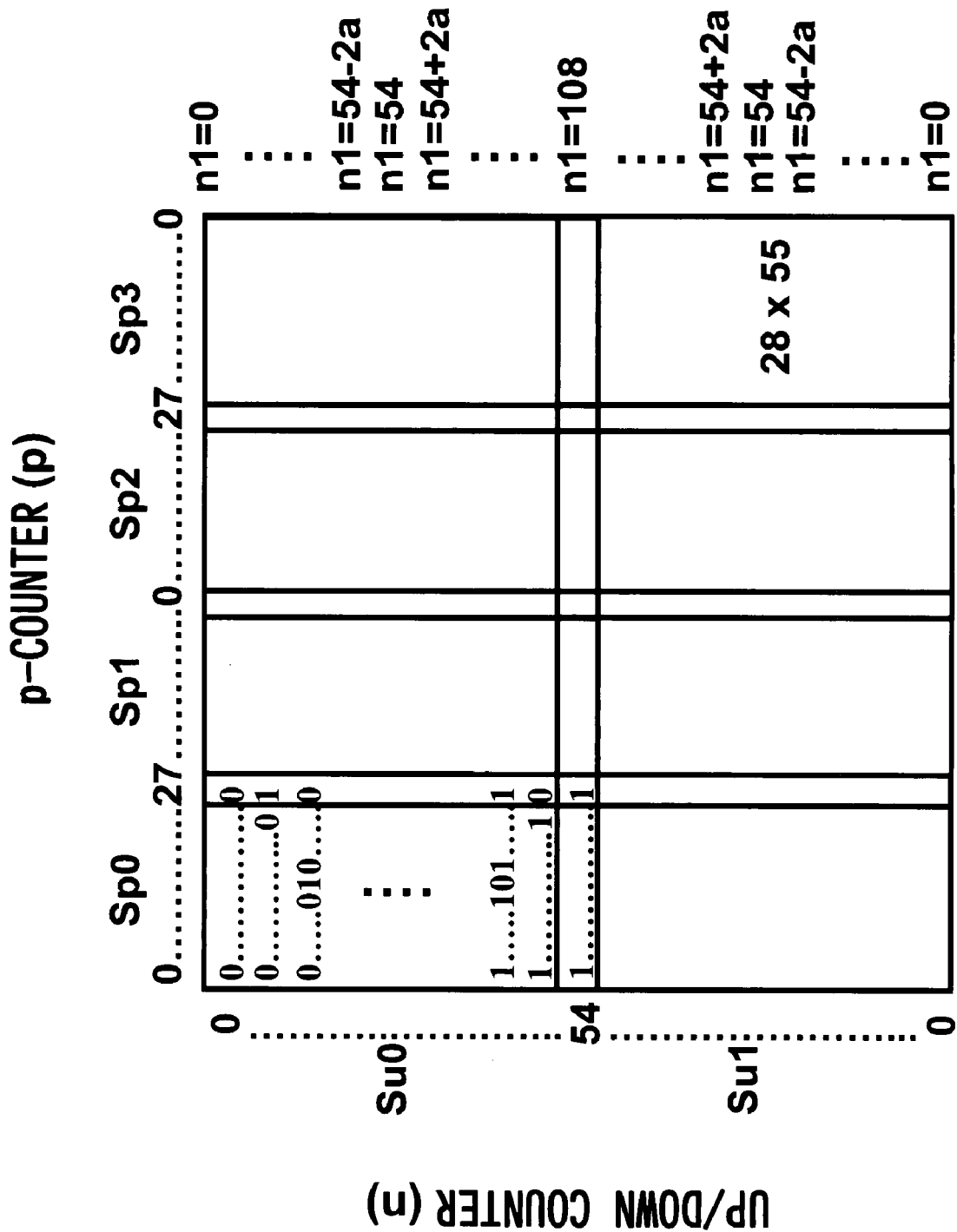
FIG. 4, which is a diagram useful in describing the operating principles of the present invention, illustrates 28×55 combinations of down-signal generation.

In accordance with the example of the present invention, the p-counter 22 is constituted by an up/down counter, the counting operation up to p=54 is made an up/down counting operation between 0 and 27 (27×2=54), and a mirror configuration centered on p=27 is adopted. By adding on the p-state machine 41 representing four states (Sp0, Sp1, Sp2, Sp4), the required combinational logic (logical matrix) can be made 28×55 in the controller 24, as illustrated in FIG. 4. In FIG. 4, the p-counter 22 up-counts the frequency-divided clock signal 5 of pre-divider 21 from 0 to p=27, down-counts this signal from p=27, again up-counts the signal from 0 to p=27, down-counts the signal from p=27 and outputs the output signal 25 at the moment p=0 is reached (namely at the moment the p-counter 22 has counted 108 of the frequency-divided clock signals). The up/down counter 23 up-counts or down-counts the output signal 25 from the p-counter 22.

Further, with the count number u=27 (n1=54) of up/down counter 23 as the center, there is a reversal in the "0" existence ratio r0 and "1" existence ratio r1 in down signal 6 in the time period of the reference period number k, where r0=1−(n1/108), r1=n1/108 holds.

When u=27−a holds, we have $r0=1-[(54-2a)/108]$, $r1=(54-2a)/108$; and when u=27+a holds, we have $r0=(54-2a)/108$, $r1=1-(54-2a)/108$ By utilizing this, the operation of the up/down counter 23 is made an up/down counting operation over the range 0 to 27 in a manner similar to the p-counter 22, and the up/down counter 23 is provided with the u-state machine 42 representing four states (Su0, Su1, Su2, Su3, where the state machine transitions as follows: Su0--->Su1--->Su2--->Su3--->Su0--->...). When the u-state machine 42 is Su1, Su2, the output signal is logically inverted by the inversion control circuit 43, thereby making the 27×2 configuration possible. That is, in a case where the state values of the u-state machine 42 of up/down counter 23 are Su1, Su2, the controller 24 generates the down signal n1 based upon a value obtained by logically inverting the decoded value of the count value.

Although there is no specific limitation, this example is such that the value in the u-state machine 42 of up/down counter 23 is supplied together with the count value of up/down counter 23 to the controller 24 via a signal line 27, by way of example.

Figure 5:
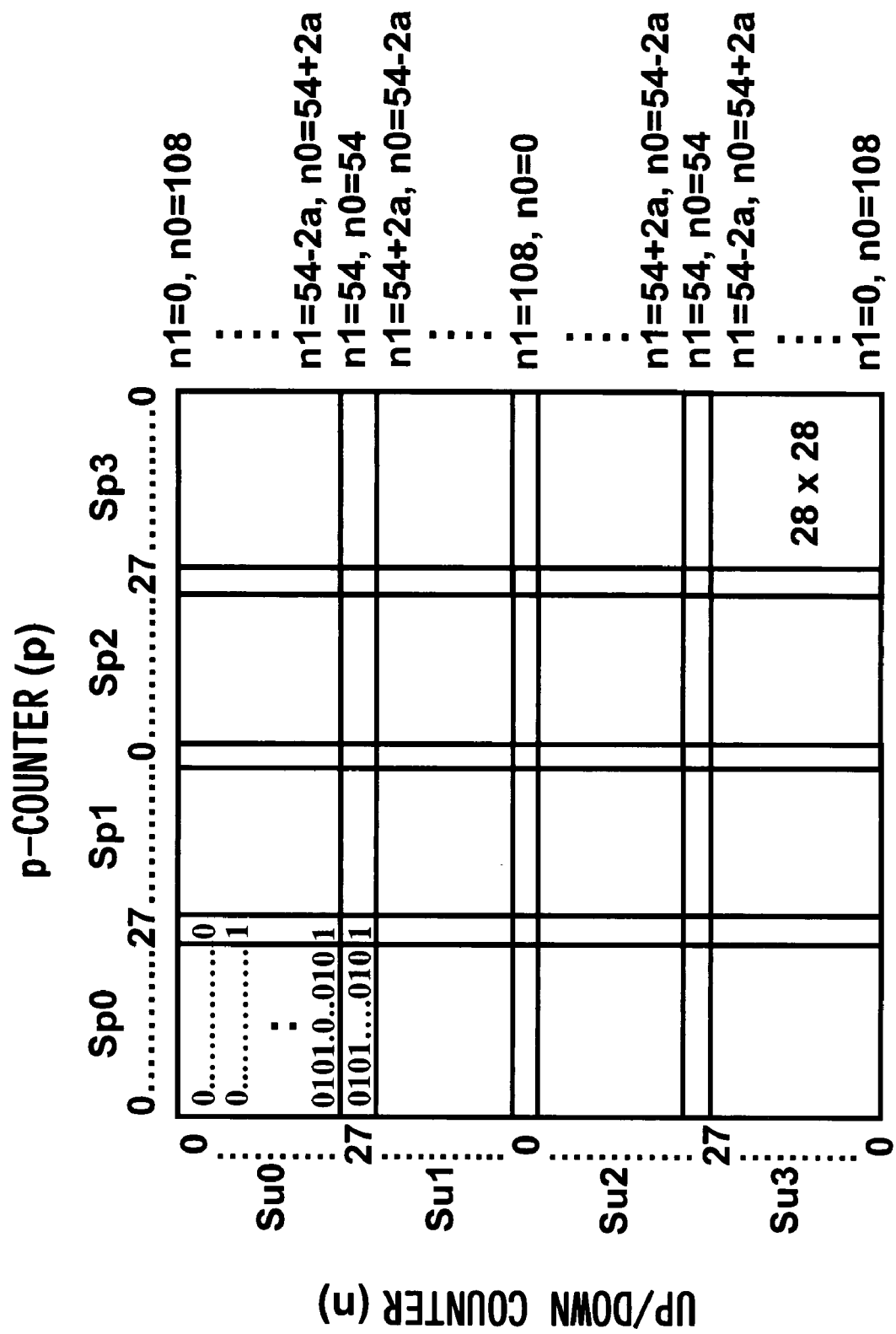
FIG. 5, which is a diagram useful in describing the operating principles of the present invention, illustrates 28×28 combinations of down-signal generation.

In another implementation, the combinational logic (logical matrix) of the down signal produced based upon the count values of p-counter 22 and up/down counter 23 is made solely a 28×28 arrangement, as illustrated in FIG. 5, and the counters 22 and 23 are provided with the p-state machine 41 and u-state machine 42, respectively, in the manner described above. By performing an up/down counting operation between the count values 0 and 27 and performing a logical inversion by the inversion control circuit 43 of controller 24, it is possible to generate a down signal of 108×108 combinations. In FIG. 5, n0 is the number of "0"s in down signal 6 in the time period of the reference period number k.

Figure 6:
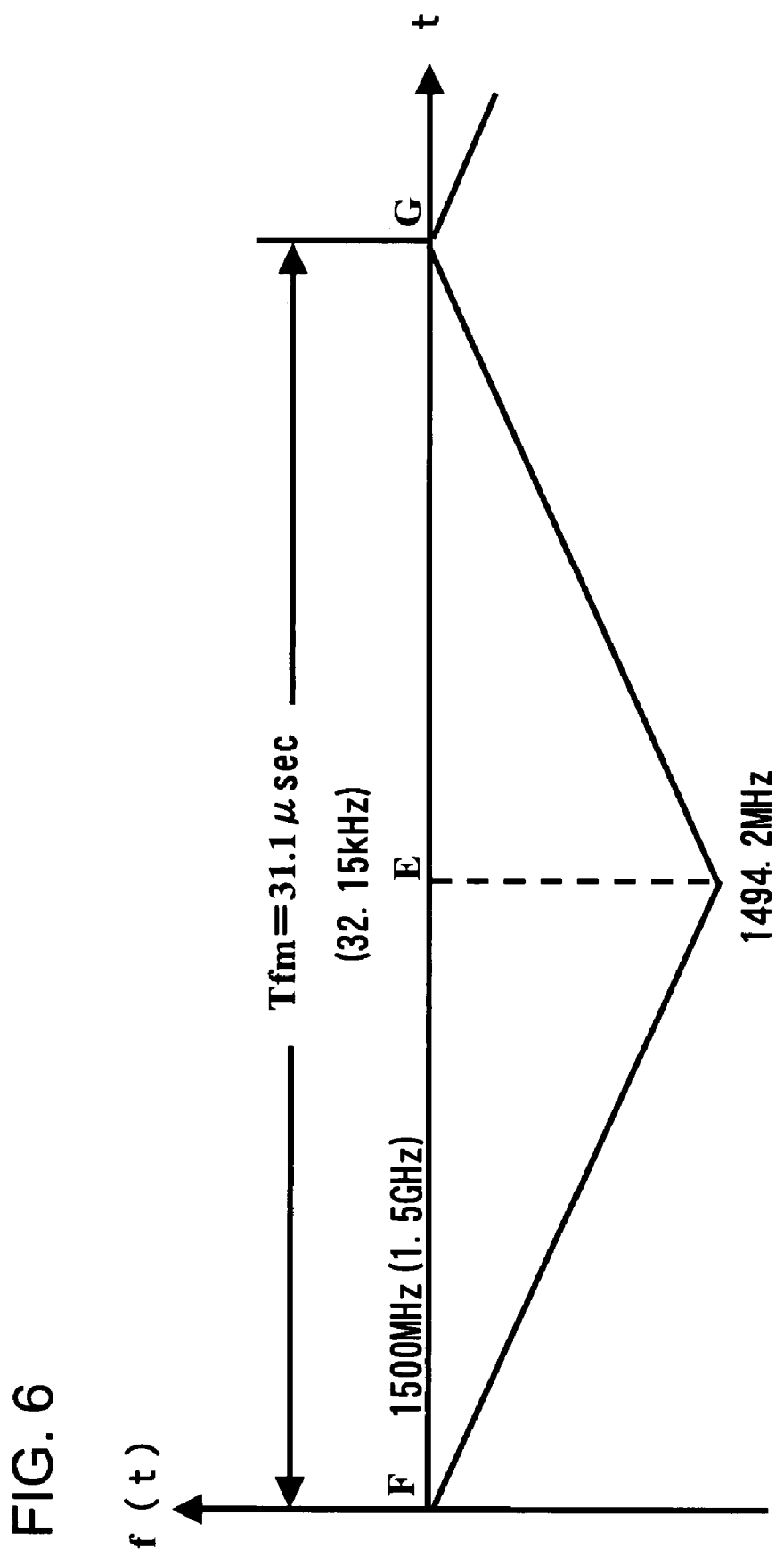
FIG. 6 is a diagram illustrating a modulation waveform in first example of present invention.

FIG. 6 is a diagram illustrating the modulated waveform of the example in which the counters 22 and 23 and controller 24 are arranged as shown in FIG. 5. As shown in FIG. 6, the modulation frequency of the output clock signal from the output terminal 2 is 32.15 kHz [1.5 GHz/(2×4×108×54)].

The p-counter 22 and up/down counter 23 are both set to initial values of 0, the state machines 41 and 42 are set to Sp0 and Sp0, and the value in p-counter 22 is updated by the clock signal 5 from the pre-divider 21.

The frequency-divided clock signal 5 is supplied to the p-counter 22. When the p-state machine 41 is Sp0, the p-counter 22 up-counts successively from 0 to 27. When the count value reaches 27, the p-counter 22 updates the p-state machine 41 to Sp1 simultaneously. When the p-state machine 41 is Sp1, the p-counter 22 down-counts successively from 27 to 0. When the count value becomes 0, the p-counter 22 updates the p-state machine 41 to Sp2 simultaneously.

The p-counter 22 up-counts successively from 0 to 27 when the p-state machine 41 is Sp2. When the count value reaches 27, the p-counter 22 updates the p-state machine 41 to Sp3 simultaneously.

The p-counter 22 down-counts successively from 27 to 0 when the p-state machine 41 is Sp3. When the count value reaches 0, the p-counter 22 returns the p-state machine 41 to Sp0 simultaneously and outputs the output signal 25 (a one-shot pulse) to update the value in the up/down counter 23.

The up/down counter 23 is updated whenever the p-counter 22 makes one full cycle. In a manner similar to that of the p-counter 22, the up/down counter 23 up-counts successively from 0 to 27 when the u-state machine 42 is Su0. When the count value reaches 27, the up/down counter 23 updates the u-state machine 42 simultaneously.

The value from the u-state machine 42 of up/down counter 23 is supplied to the controller 24 (signal 27 in FIG. 1). When the u-state machine 42 is Su0, the number n1 of logical "1"s of down signal 6 in the time period of the reference period number k (=m×p) is made as follows, by way of example:

$n1=2u$ based upon the values in the counters 22 and 23, where u is the up-count value (0 to 27) of up/down counter 23 when the u-state machine 42 is Su0.

The up/down counter 23 successively down-counts from 27 to 0 when the u-state machine 42 is Su1. When the count reaches 0, the up/down counter 23 updates the u-state machine 42 to Su2 simultaneously.

When the u-state machine 42 is Su2, the controller 24 makes the number n1 of logical "1"s of down signal 6 in the time period of the reference period number k (=m×p) as follows:

$n1=108-2u$ where u is the down-count value (27 to 0) of up/down counter 23 when the u-state machine 42 is Su1. The inversion control circuit 43 performs inversion control of a signal, which is the output signal of a decoder (not shown) that decodes the count value, and which is necessary to create a value corresponding to 108−2u, instead of 2u of Su0 from the down-count value u of up/down counter 23.

When the u-state machine 42 is Su2, the up/down counter 23 up-counts successively from 0 to 27. When the count value reaches 27, the up/down counter 23 updates the u-state machine 42 to Su3 simultaneously.

When the u-state machine 42 is Su2, the controller 24 makes the number n1 of logical "1"s of down signal 6 in the time period of the reference period number k (=m×p) as follows:

$$n1=108-2u$$

where u is the up-count value (0 to 27) of up/down counter 23 when the u-state machine 42 is Su2. The inversion control circuit 43 performs inversion control of a signal which is the output signal of a decoder (not shown) that decodes the count value and which is necessary to create a value corresponding to 108−2u, instead of 2u of Su3 from the down-count value u of up/down counter 23.

When the u-state machine 42 is Su3, the up/down counter 23 down-counts successively from 27 to 0. When the count value becomes 0, the up/down counter 23 returns the u-state machine 42 to Su0 simultaneously. When the u-state machine 42 is Su3, the controller 24 makes the number n1 of logical "1"s of down signal 6 in the time period of the reference period number k (=m×p) as follows:

$$n1=2u$$

where u is the down-count value (27 to 0) of up/down counter 23 when the u-state machine 42 is Su3.

The controller 24 is controlled by the count values in p-counter 22 and up/down counter 23 and the u-state machine 42 (Su0 to Su3) of up/down counter 23 and produces the output signal (down signal) 6 based upon the combination of count values p, u. When the u-state machine 42 of up/down counter 23 is Su0, Su3, the controller 24 delivers the output as is (uninverted). That is, with regard to the down signal 6 that is output from the controller 24, the number n1 of logical "1"s in the time period of the reference period number k (=m×p) when the u-state machine 42 is Su0, Su3 is made n1=2u. On the other hand, when the u-state machine 42 of up/down counter 23 is Su1, Su2, the output of the down signal 6 is controlled by the inversion control circuit 43 in such a manner that the signal is output upon being inverted from the state that prevailed when the u-state machine 42 was Su0, Su3. That is, with regard to the down signal 6 that is output from the controller 24, the number n1 of logical "1"s in the time period of the reference period number k (=m×p) when the u-state machine 42 is Su1, Su2 is made n1=108−2u.

In accordance with this example, it is possible to reduce the number of logical combinations necessary in the controller 24 owing to the logical folding effect. This makes it possible to reduce the scale of the circuitry.

Figure 13:
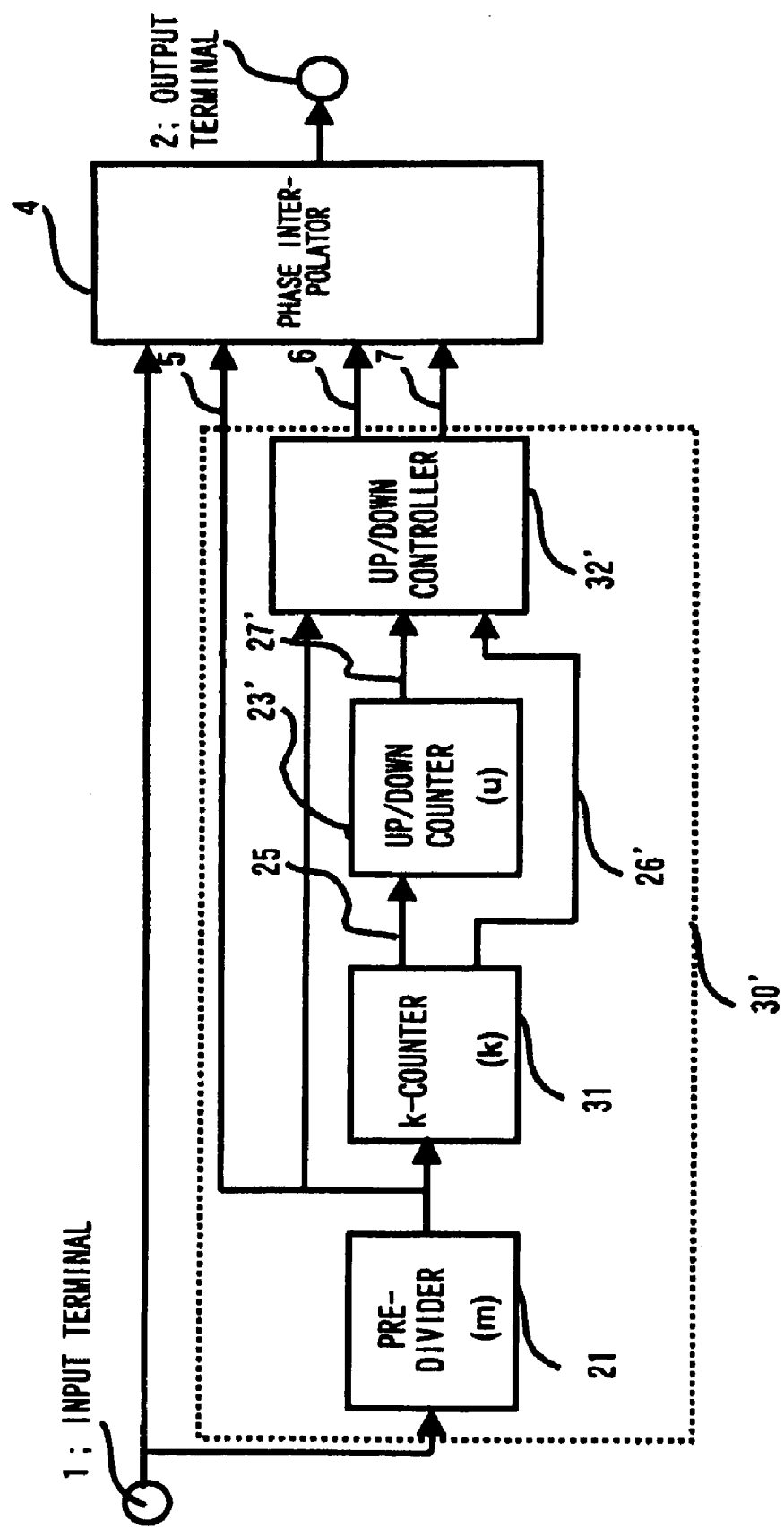
FIG. 13 is a diagram illustrating the configuration of a first example in Patent Document 1.

The present invention is also applicable on the up side as an up-down controller for generating an up signal 7 and the down signal 6, in which the modulated waveform is a triangular wave, as in the arrangement of FIG. 13 disclosed in Patent Document 1 (the first example of the patent document). In FIG. 13, a k-counter 31 has a structure similar to that of the p-counter 22 of FIG. 1, and the up/down counter 23 also has a structure similar to that shown in FIG. 1.

Figure 7:
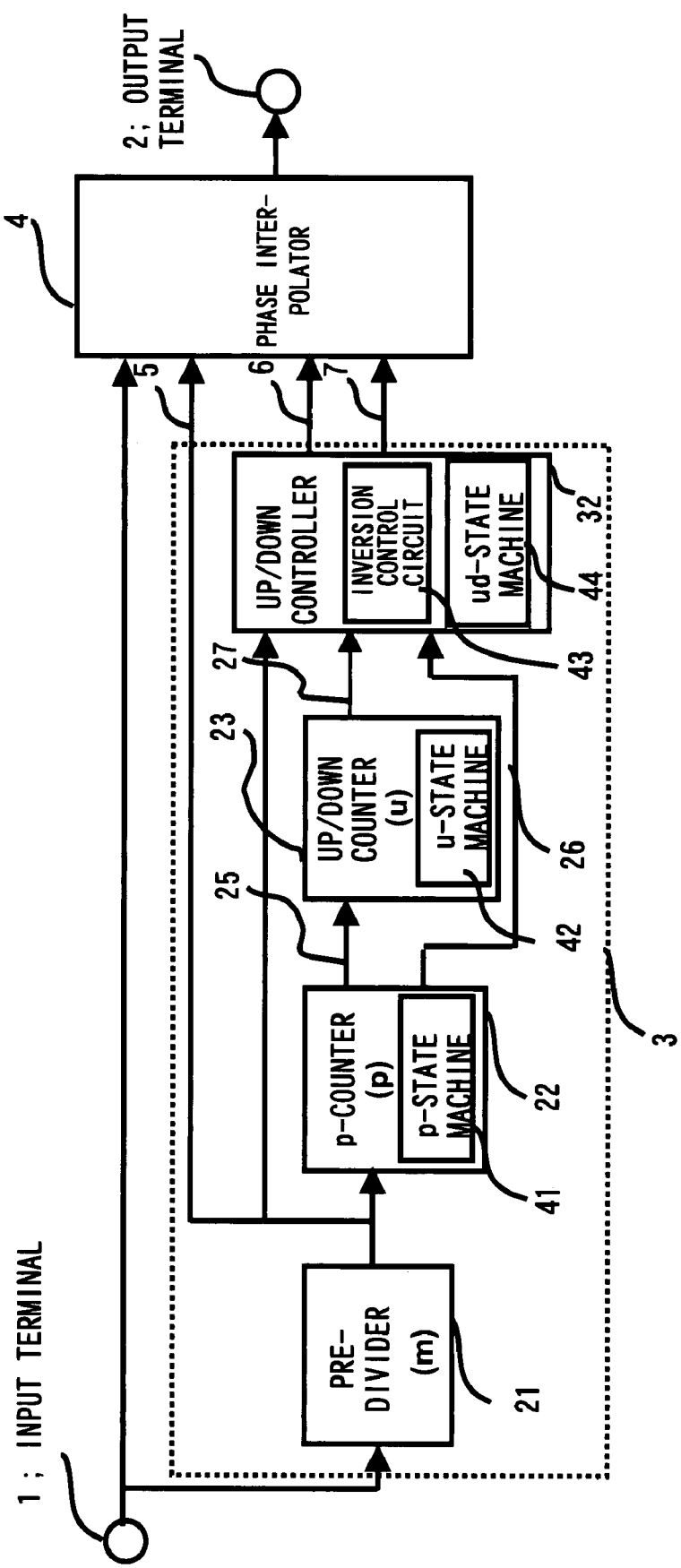
FIG. 7 is a block diagram illustrating the configuration of a second example of the present invention.

FIG. 7 is a diagram illustrating the configuration of a second example of the present invention. This shows an implementation in which the present invention is applied to the arrangement of FIG. 13.

An up/down controller 32 has combinational logic and the inversion control circuit 43, and is equipped with a ud-state machine 44 (Sud0, Sud1) for up/down changeover. It will suffice to adopt an arrangement in which whenever the up/down counter value makes one full cycle, there is a changeover between Sud0 and Sud1, the up signal 7 is output at the time of Sud0 and the down signal 6 is output at the time of Sud1 (see FIG. 7). Upon receiving the up signal 7, the phase interpolator 4 outputs a clock, which has been advanced in phase by a prescribed amount Δ, from the output terminal 2. Upon receiving the down signal 6, the phase interpolator 4 outputs a clock, which has been retarded in phase by the prescribed amount Δ, from the output terminal 2.

Figure 8:
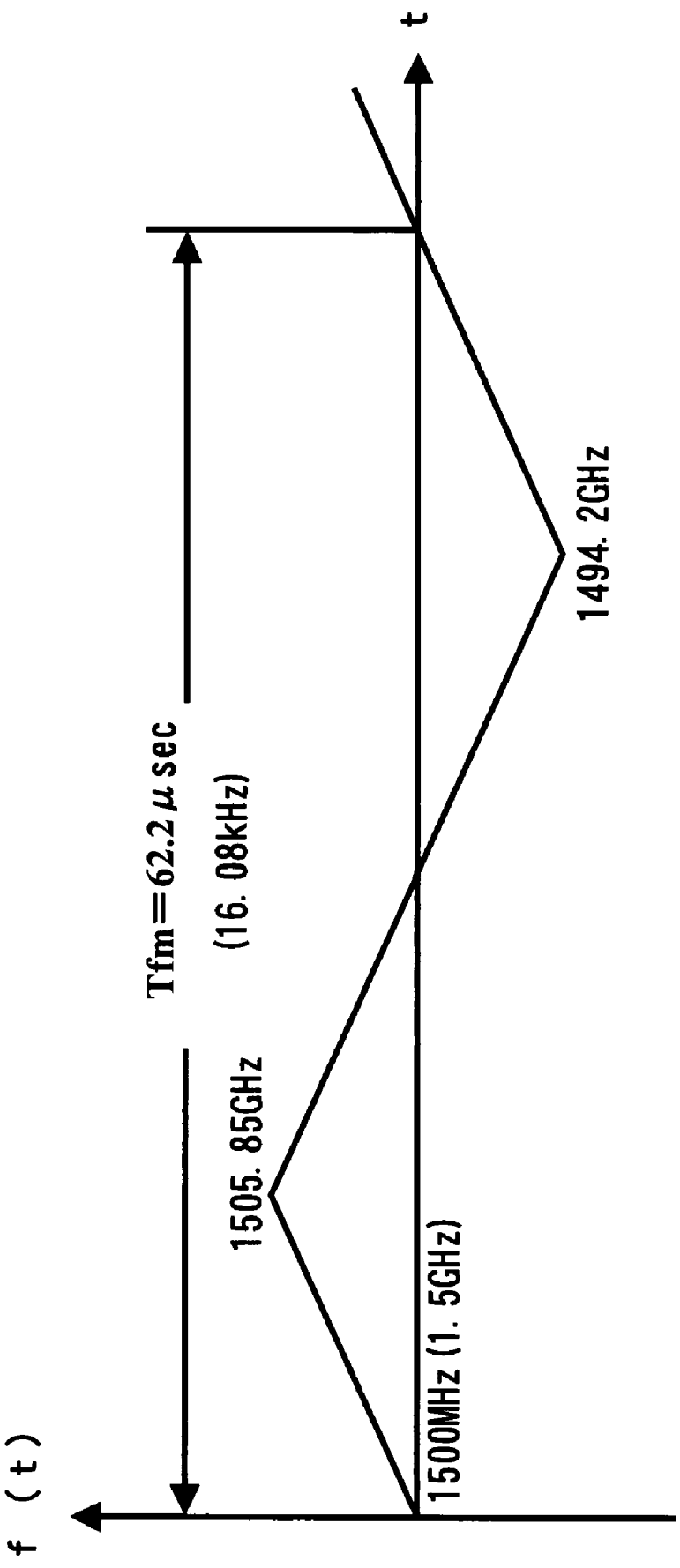
FIG. 8 is a diagram illustrating a modulation waveform in the second example of present invention.

In this example, in a manner similar to that of the first example, a modulated waveform of the kind shown in FIG. 8 is produced. This waveform is obtained when the phase step of the phase interpolator 4 is made 1/64 of the period $T_0$ of the clock signal and the preliminary frequency division number m is made 4.

In each of the foregoing examples, the phase interpolator 4 can be the interpolator having the structure described in Patent Document 1 or can employ any circuit that shifts phase based upon a control signal.

Though the present invention has been described in accordance with the foregoing examples, the invention is not limited to these examples and it goes without saying that the invention covers various modifications and changes that would be obvious to those skilled in the art within the scope of the claims.

It should be noted that other objects, features and aspects of the present invention will become apparent in the entire disclosure and that modifications may be done without departing from the gist and scope of the present invention as disclosed herein and claimed as appended herewith.

Also it should be noted that any combination of the disclosed and/or claimed elements, matters and/or items may fall under the modifications aforementioned.

What is claimed is:

1. A spread spectrum clock control apparatus which exercises control to supply a phase control signal to a phase interpolator which receives an input clock signal and varies the phase of an output clock signal in accordance with the phase control signal, and to frequency-modulate the output clock signal, the apparatus comprising:

a first counter which receives a frequency-divided clock signal, changes over from up-counting to down-counting at a predetermined first count number, performs the up-counting and down-counting a prescribed number of times and outputs an output signal when a predetermined prescribed count number has been counted, said first counter having a state machine for managing transition of state;

a second counter which receives the output signal from said first counter and changes over from up-counting to down-counting at a predetermined second count number, said second counter having a state machine for managing transition of state; and a controller which controls said phase control signal supplied to said phase interpolator, based upon count values of said first and second counters and state of said second counter.

2. The apparatus according to claim 1, wherein the controller uses the same combinational logic as when the first counter repeats the counting operation.

3. The apparatus according to claim 1, wherein said first counter makes state transitions sequentially from an initial state whenever there is a changeover between up-counting and down-counting, and, when a count equivalent to the prescribed count number makes one full cycle, returns the state to the initial state and outputs the output signal to thereby update the count value in said second counter.

4. The apparatus according to claim 1, wherein said second counter changes over from up-counting to down-counting at the second count number, repeats a set of up-counting and down-counting operations a prescribed number of times, makes state transitions sequentially at every counting operation and returns the state to the initial state when the count makes one full cycle; and said controller controls the number of times the phase control signal is activated in a predetermined reference period, based upon the count value in said first counter, the count value in said second counter and the state of said second counter.

5. The apparatus according to claim 4, wherein said controller increases or decreases, in even-numbered units in response to one change in the count value in said second counter, thenumber of the phase control signals activated in the reference period.

6. The apparatus according to claim 4, further comprising
a frequency dividing circuit which receives the input clock signal and frequency-divides the input clock signal to output the frequency-divided clock signal;
wherein said first counter counts the frequency-divided clock signal;
said controller receives the frequency-divided clock signal and the count values from said first and second counters; and
the reference period is stipulated by the product of a frequency division number in said frequency dividing circuit, the prescribed count number of said first counter and the clock period of the input clock signal.

7. The apparatus according to claim 4, wherein said controller, in regard to deciding the number of active states of the phase control signal in the reference period, from the count value in said first counter, the count value in said second counter and the state thereof, includes a control circuit which, in a case where the state of said second counter is a predetermined one state, logically inverts a signal that was a non-inverting signal in another state of said second counter corresponding to the one state.

8. The apparatus according to claim 1, wherein said controller outputs to said phase interpolator a down signal, which retards the phase of the output clock signal, as the phase control signal.

9. The apparatus according to claim 1, wherein said controller outputs to said phase interpolator a down signal, which retards the phase of the output clock signal, or an up signal, which advances the phase of the output clock signal, as the phase control signal.

10. The apparatus according to claim 1, wherein said controller outputs to said phase interpolator a down signal, which retards the phase of the output clock signal, and an up signal, which advances the phase of the output clock signal, as the phase control signal, and holds the up and down states.

11. The apparatus according to claim 10, wherein the controller uses the same combinational logic as when the first counter repeats the counting operation in up-counting and down-counting operations.

12. A spread spectrum clock generating apparatus comprising
a phase interpolator which receives an input clock signal and varies the phase of an output clock signal in accordance with a phase control signal; and
a spread spectrum clock control apparatus which exercises control to supply the phase control signal to said phase interpolator and to frequency-modulate the output clock signal;
wherein said spread spectrum clock control apparatus is the spread spectrum clock control apparatus set forth in claim 1.

* * * * *